United States Patent [19]

Lesmeister

[11] Patent Number: 5,345,186
[45] Date of Patent: Sep. 6, 1994

[54] RETRIGGERED OSCILLATOR FOR JITTER-FREE PHASE LOCKED LOOP FREQUENCY SYNTHESIS

[75] Inventor: Gary J. Lesmeister, Hayward, Calif.
[73] Assignee: Credence Systems Corporation, Fremont, Calif.
[21] Appl. No.: 5,651
[22] Filed: Jan. 19, 1993
[51] Int. Cl.[5] ............... H03K 5/26; H03L 7/087
[52] U.S. Cl. ............... 328/155; 307/262; 331/1 A; 331/25; 331/57
[58] Field of Search ............... 307/511, 514, 262; 328/55, 155; 331/1 A, 25, 57

[56] References Cited

U.S. PATENT DOCUMENTS

| | | | |
|---|---|---|---|
| 4,091,335 | 5/1978 | Giolma et al. | 331/1 A |
| 4,244,043 | 1/1981 | Fujita et al. | 331/57 |
| 4,902,986 | 2/1990 | Lesmeister | 331/25 |
| 5,059,924 | 10/1991 | JenningsCheck | 331/1 A |
| 5,068,628 | 11/1991 | Ghoshal | 328/155 |
| 5,075,640 | 12/1991 | Miyazawa | 331/25 |
| 5,077,529 | 12/1991 | Ghoshal et al. | 328/155 |
| 5,136,260 | 8/1992 | Yousefi-Elezei | 307/603 |
| 5,233,314 | 8/1993 | McDermott et al. | 328/155 |
| 5,233,316 | 8/1993 | Yamada et al. | 331/1 A |

*Primary Examiner*—Timothy P. Callahan
*Attorney, Agent, or Firm*—Smith-Hill and Bedell

[57] ABSTRACT

An embodiment of the present invention is a retriggered oscillator timebase including a phase lock loop controlled ring for direct retriggering by a reference oscillator. The ring has taps at various successive stages that are output to an on-the-fly selector that can add any ten-bit value to a current-tap selection to enable a next-tap selection. Such on-the-fly addition can increase the period of a signal each cycle and thereby divide the reference frequency. Ring outputs are also used to drive two other retriggered rings for a plurality of NANO timing generators. The use of two rings allows retriggering of one of the rings before the other has completed a whole one-shot cycle. An on-the-fly selector subtracts a value from a present "NANO" select to a next "NANO" select to convert back the timebase to the fixed reference frequency for phase and frequency comparison. The subtraction acts as a frequency multiplication whose output "$t_{0fx}$" is equal to the reference frequency.

7 Claims, 3 Drawing Sheets

RETRIGGERED OSCILLATOR FOR JITTER-FREE PHASE LOCKED LOOP FREQUENCY SYNTHESIS

BACKGROUND OF THE INVENTION

1. Field of the Invention

The present invention relates to retriggerable oscillators and more particularly to voltage controlled ring oscillators.

2. Description of the Prior Art

Various kinds of electronic test equipment and circuit analyzers depend upon clocks and other triggers that will signal when to sample a device-under-test (DUT) or when to start/end some other process. The quality of such clocks and triggers is typically dependent on the stability and absence from jitter of a phase locked loop (PLL) that synchronizes a ring oscillator to a main timing reference source. If the range and granularity of the required signals needed were not so stringent, a simple oscillator with a digital counter operating at a high harmonic frequency of the needed fundamental frequencies could be used to generate the required multi-phase signals. But high performance testers must generate a signal or a pair of signals that can be varied with predictable resolutions in period to a few nanoseconds and range from zero to a hundred megahertz (Hz). Therefore multi-stage ring oscillators have been conventionally employed to produce phase shifted signals locked to a reference frequency that can be combined to produce the necessary outputs.

Ghoshal, et al., describe in U.S. Pat. No. 5,077,529, issued Dec. 31, 1991, a wide bandwidth digital phase locked loop (DPLL) with reduced low frequency intrinsic jitter. One of several available taps on a multi-stage ring oscillator is selected by a frequency adjustment circuit that allows any consecutive phase of oscillator to be selected. The selection output is used to clock a DPLL. A high-speed clock may be advanced or retarded by selecting a different phase tap. A reference input clock is input via a phase detector in the DPLL. The high-speed clock is operated at twelve times the DPLL frequency clock to reduce jitter. Ghoshal, et al., claim a reduction of ten times in the low frequency jitter of the DPLL over prior art methods.

Current-controlled ring oscillators in phase lock loops are conventional, as exemplified by the teachings of Giolma, et al., in U.S. Pat. No. 4,091,335, issued May 23, 1978. A ring is comprised of lateral PNP current sources and Schottky clamped NPN transistors to provide a frequency range of four megahertz at fifty microamp drive to forty-three megahertz at one milliamp drive. The frequency of the ring oscillator is varied by adjusting the current injected into the ring. Such ring oscillators require less chip area to implement and less frequency error to produce correction. Therefore, ring oscillators can suffer from less jitter.

A PLL configured as a frequency multiplier capable of non-integral feedback path division is described by JenningsCheck in U.S. Pat. No. 5,059,924, issued Oct. 22, 1991. A multiphase voltage controlled oscillator (VCO) generates a plurality of signals 10a–10f having substantially identical frequency but each are offset equally from the next by a given phase angle. A commutator selects signals of adjacent phases for a time average output signal with a frequency higher or lower than signals 10a–10f. Frequency translation is done by periodically selecting signals having a longer or shorter period as desired so the output signal is delayed or advanced by the appropriate amount. Such a PLL is capable of converting a. 1.544 MHz signal to a 2.048 MHz signal, and vice versa, and which are not integer multiples of the other, as would otherwise be necessary with a conventional VCO.

U.S. Pat. No. 4,902,986, issued Feb. 20, 1990, to the present inventor, Gary Lesmeister, describes a PLL for precise frequency and phase tracking of two signals that are calibrated to an external reference signal. Such patent is incorporated herein by reference as if fully laid out. An implementation is described which is suitable for inclusion into an integrated circuit (IC). The device comprises a ring oscillator for generating a calibration signal that oscillates at a first frequency and a power supply for sourcing a compensated power signal to the ring oscillator. The first frequency is variable based on the voltage of the compensated power signal. A phase detector is used to detect a relative phase between the calibration signal and the external reference signal. The compensated power signal is also used for critical data paths within the IC where precise timing is required. In a tester, a plurality of signals are extracted from the ring oscillator with a multitude of taps that have signals which oscillate at the same frequency as the calibration signal but each of which differ from it by different phase angles. Such difference in phase angle will be equal to 360° divided by the number of stages (N) in the ring oscillator. The signals from the taps are combined in multiplexers to form test signals that can be applied to a device-under-test (DUT). Thirty-one stages are shown in FIG. 5 of the subject patent, yielding 360°/31, or 11.6° of phase shift per stage.

FIG. 1 illustrates a PLL 10 with a ring oscillator 12 made up of an odd number (N) of ring of inverters 14 and a combination phase detector and charge pump 16 that maintains a phase lock of the ring oscillator 12 to a signal input from a reference oscillator (ROSC) 18. A timing path 20 with an associated delay allows the ring oscillator 12 to lead. ROSC 18 in phase to compensate for timing edge generator and other unavoidable logic delays. An amplifier 22 powers the ring oscillator 12 with a voltage VPLL that will adjust the transition delays of each inverter 14 such that the total of all the delays in the ring add up to the period of the ROSC 18. The ring oscillator 12 oscillates at the same frequency as the ROSC 18 as long as the ROSC 18 is within the lock range of the PLL 10. Prior art testers and associated ICs use such configurations to eliminate CMOS process and temperature effects that are detrimental to stable time generation. The ring oscillator 12 is frequency-locked but not directly coupled to the ROSC 18. Therefore, the ring oscillator 12 may be phase shifted to compensate for the undesirable effects of process and temperature variances in certain critical timing paths. However, the phase shifting configuration exacerbates higher frequency jitter effects. In modern high-performance testers, such jitter cannot be tolerated, but neither can expensive remedies.

Prior art attempts to control jitter have resorted to various filters and external components. A voltage follower and filter external to a tester IC were discovered by the present inventor to offer some of the stability needed for a high-performance system, but the resulting jitter was nevertheless still within the upper limits of what is acceptable. So such a system is limited in period agility.

A conventional tester IC timebase 24 is shown in FIG. 2. A reference signal from a ROSC 25 is loosely coupled to a clock and a plurality of timing edge generator (TEG) signals from a ring oscillator 26 through a PLL control voltage (VPLL). Such a loose coupling allows the outputs of ring oscillator 26 to accumulate undesirable phase errors until a correction to VPLL can respond through a loop delay equal to the phase error of ROSC to $t_{0fx}$. The phase error varies with time and appears as phase jitter with respect to ROSC 25. The ring oscillator 26 allows a multitude of taps, equal to the number N of elements in the ring oscillator, to sample ROSC 25 at N number of phase delays. The phase delay time between adjacent taps separated by one ring element is the inverse of "N" times ROSC. A synthesized frequency may be generated by selecting one tap and then another separated in phase by a time equal the period of the desired frequency to be synthesized. A plurality of timing edge generators 27 are used to implement such tap selection in real time. For example, with ROSC 25 equal to fifty MHz, the ring oscillator period will be twenty picoseconds. If there were twenty elements to the ring oscillator, each with a delay of two picoseconds, frequencies with periods only two picoseconds apart could be synthesized by appropriate tap selection. A phase lock loop 28 varies a voltage VPLL to keep the ring element delays at precisely two picoseconds. But, variations in semiconductor fabrication processes and temperatures will conspire to throw the frequency of ring oscillator 26 off its target.

A variability in the frequency of ROSC 25 allows a testing system to be constructed that can generate synthesized frequencies having periods from twenty to forty picoseconds in very small increments. But since the number of taps on the ring is fixed, the resolution at twenty-five MHz is forty picoseconds compared to twenty picoseconds at fifty MHz. Therefore, the synthesizable frequency granularity can degrade dramatically when changing reference frequencies, for example fifty MHz to twenty-five MHz.

In the prior art, VCO spanning requirements of a 2:1 frequency range will necessarily limit the stability of a PLL. Changing the reference period in such a case will also complicate calculations for a target synthesized frequency. Furthermore, timing noise and errors will typically increase as ROSC approaches twenty-five MHz. At twenty-five MHz, the timing path delay is more than doubled, thus decreasing performance and accuracy, and that increases the complexity of the circuitry. Since ROSC is loosely coupled to the clock and the timing edge generator (TEG) signals from the RING through VPLL, this loose coupling means the RING outputs will accumulate undesirable phase errors, imposed by environmental changes, until VPLL responds via the loop delay with respect to the ROSC to $t_{0fx}$ phase error. This phase error varies with time and appears as phase jitter with respect to ROSC.

SUMMARY OF THE PRESENT INVENTION

It is therefore an object of the present invention to provide a timebase for a tester that has reduced levels of jitter and that can be readily incorporated into an integrated circuit.

Briefly, an embodiment of the present invention includes a retriggered oscillator timebase including a phase lock loop controlled ring for direct retriggering by a reference oscillator. The ring has taps at various successive stages that are output to an on-the-fly selector that can add any ten-bit value to a current-tap selection to enable a next-tap selection. Such on-the-fly addition can increase the period of a signal each cycle and thereby divide the reference frequency. Ring outputs are also used to drive two other retriggered rings for a plurality of NANO timing generators. The use of two rings allows retriggering of one of the rings before the other has completed a whole one-shot cycle. An on-the-fly selector subtracts a value from a present "NANO" select to a next "NANO" select to convert back the timebase to the fixed reference frequency for phase and frequency comparison. The subtraction acts as a frequency multiplication whose output "$t_{0fx}$" is equal to the reference frequency.

An advantage of the present invention is that it provides a oscillator timebase that requires only a single reference frequency.

Another advantage of the present invention is that it provides an oscillator with an on-the-fly period switching to any frequency with a fifty picosecond resolution.

A further advantage of the present invention is that it provides an oscillator with more than a two fold improvement in resolution over prior art designs.

A further advantage of the present invention is that it provides an oscillator having significantly less jitter than prior art designs.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
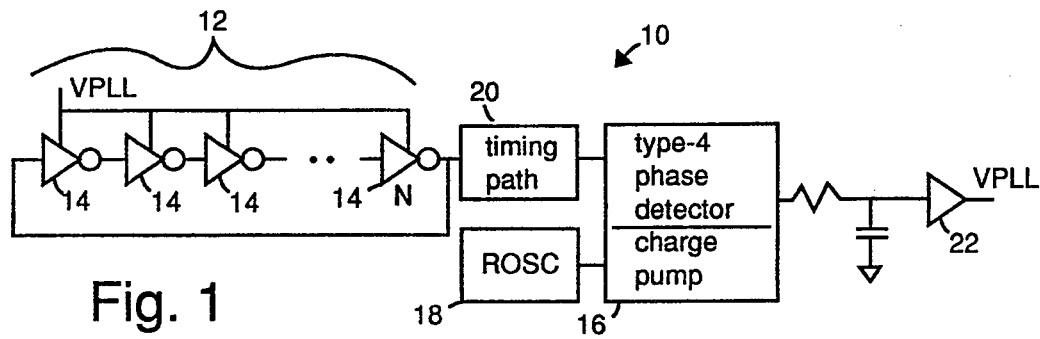
FIG. 1 is a schematic diagram of a prior art ring oscillator and phase lock loop control.
Figure 3:
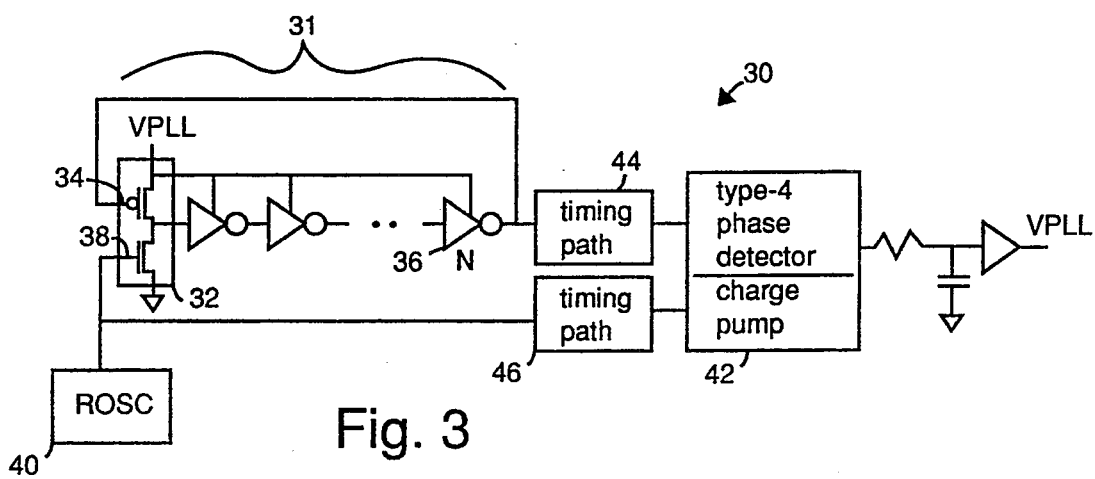
FIG. 3 is a schematic diagram of a phase lock loop retriggered oscillator timebase according to the present invention.
Figure 2:
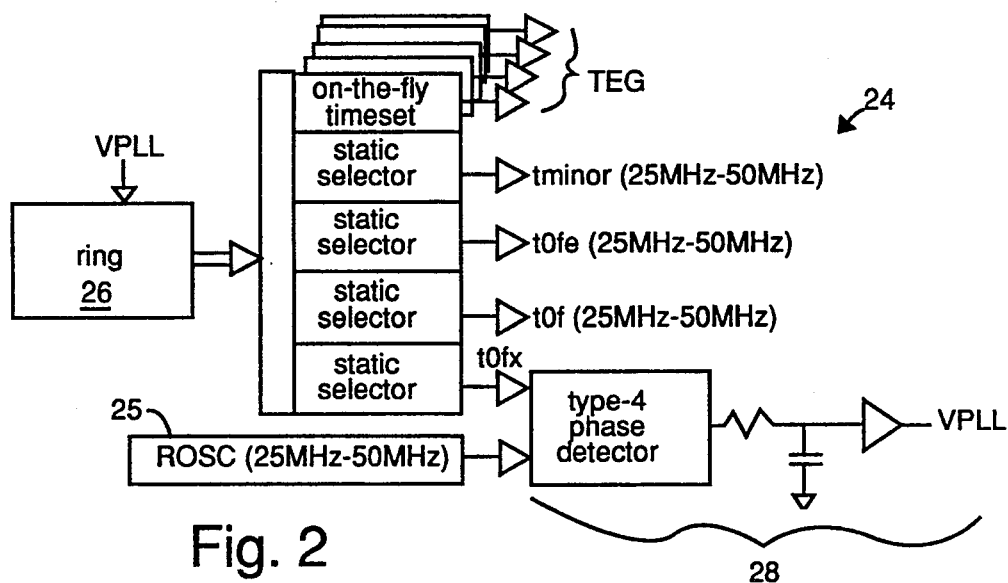
FIG. 2 is block diagram of a conventional IC tester timebase.

FIG. 3 illustrates a phase lock loop (PLL) retriggered oscillator timebase 30 including a ring oscillator 31 that is similar to a standard ring oscillator, with at least one exception. A first inverter 32 has a p-gate 34 connected to a last inverter 36 and an n-gate 38 connected to a ROSC 40. Such a hybrid configuration has many of the beneficial characteristics of both a standard ring and a tapped delay line, while at the same time eliminating many of the detrimental characteristics of both. Ring oscillator 31 is not free running. ROSC 40 directly controls the frequency and phase of ring oscillator 31. A PLL control voltage (VPLL) can therefore only control the individual and accumulated delays through ring oscillator 31. However, since a PLL 42 cannot control the phase of ring oscillator 31, the necessary timing path cannot be inserted in the ring input to the phase detector, as in FIG. 1, without repeating a delay path in the path of ROSC 40. The adjustment of such a delay path is necessary to compensate for the effects of changing processes and temperatures. Therefore, timebase 30 includes a timing path 44 to adjust signal symmetry output from ring oscillator 31 and a timing path 46.

Figure 4:
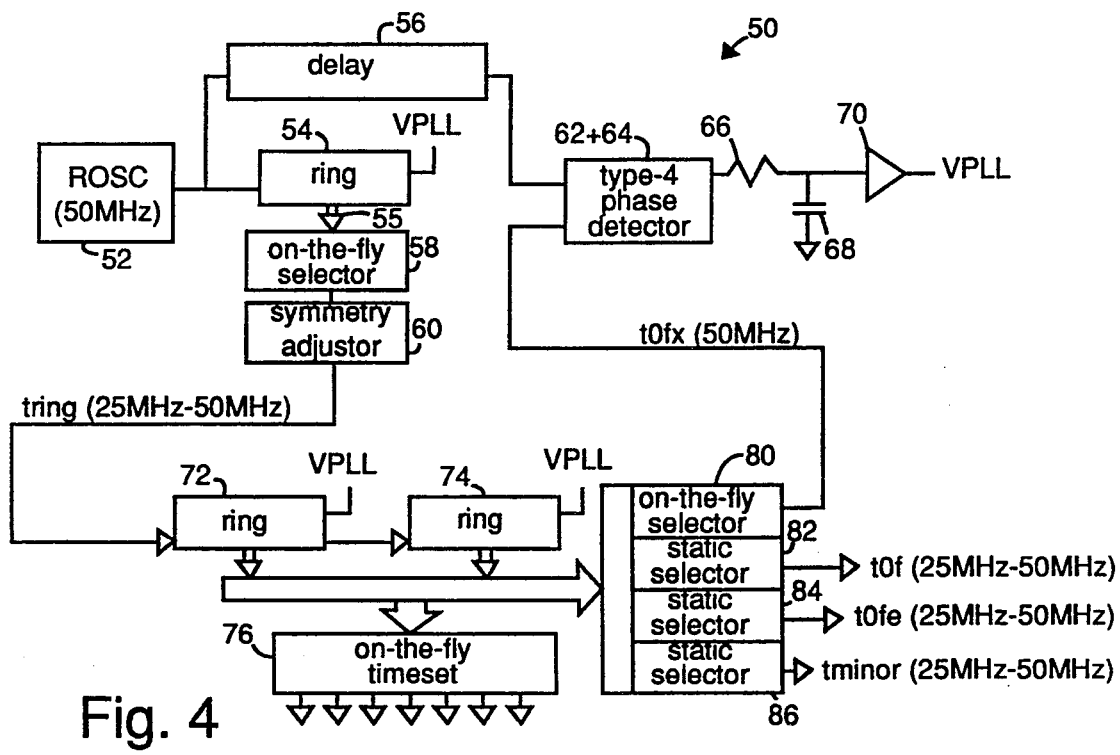
FIG. 4 is a block diagram of a retriggered single frequency timebase embodiment of the present invention.

FIG. 4 illustrates a retriggered single frequency timebase embodiment of the present invention and is referred to by the general reference numeral 50. The system 50 comprises a fifty megahertz (MHz) reference oscillator (ROSC) 52, a first retriggered ring oscillator 54 having a plurality of output taps 55, a delay line 56 for matching a particular select path, a first on-the-fly selector 58, a symmetry adjustor 60, a type-four phase detector 62, a charge pump 64, a loop filter resistor 66, a loop filter capacitor 68 and an amplifier 70. Timebase 50 further comprises a second and a third retriggered ring oscillator 72 and 74, a plurality of on-the-fly time set selectors 76, a second on-the-fly selector 80 and a first through a third static selector 82, 84 and 86.

In operation, PLL ring oscillator 54 is retriggered by ROSC 52 which typically has a fixed frequency of fifty MHz. Output taps 55 are connected in parallel to the on-the-fly selector 58 where an N-bit value is added to the value of a currently selected tap 55 to compute the value of a next tap 55 to be selected. If the selection were to dwell at any particular tap 55, the frequency appearing at an output of selector 80 would naturally be fifty MHz for the duration of the selection. This on-the-fly addition keeps increasing the period at each cycle, thus dividing the input frequency from ROSC 52 with resolutions of $1/(ROSC \cdot (N-1))$. This technique produces a precisely variable period, e.g., forty picosecond resolution when ROSC 52 is fifty MHz. Symmetry adjustor 60 provides a variable delay that corrects for process induced errors that can cause the output of selector 58 to become non-symmetrical.

The frequency of a synthesized frequency output signal is controlled by writing a twenty-bit digital word to a respective timing edge generator (TEG). The ten most significant bits (MSB), referred to as the "MAJOR" field, control the number of whole cycles of the ring frequency that will be counted for each period of the synthesized output frequency. The next six bits, referred to as "NANO" field, control the number of ring stages that will be skipped between successive connections of the on-the-fly selector. The four least significant bits (LSB), referred to as the "PICO" field, control a fine vernier phase shift in sixteen steps with all sixteen steps adding up to the phase delay of one ring stage. Table I summarizes the TEG control word.

TABLE I

| MAJOR | MINOR | | | |
|---|---|---|---|---|
| 19    10 | 9    4 | | 3    0 | |
| MAJOR | NANO | | PICO | |
| No. of Minors per Major | No. of Ring Stages | | Ring Element divided by 16 | |

In operation, a TEG generates a new frequency by determining the closest number of MAJOR, NANO and PICO phases, all of which are locked to ROSC, that will best approximate the new frequency period. For example, if ROSC is fifty MHz, and the new frequency to be synthesized is 3.58 MHz, an output with a period of approximately 279 nanoseconds $10^{-9}$ seconds) must be generated. Each MAJOR period of ROSC is twenty nanoseconds, so thirteen such periods will be needed leaving a remainder of nineteen nanoseconds $(279-(20 \cdot 13)=19)$. MAJOR will therefore be set to 0000001101, in binary for decimal thirteen. If there are thirty-one ring stages, each stage contributes 645 nanoseconds ($10^{-12}$ seconds) of delay. For nineteen nanoseconds, twenty-nine stages will be needed, leaving a remainder of 295 picoseconds $(19-(0.645 \cdot 29)=0.295)$. NANO will therefore be set to 011101, in binary for decimal twenty-nine. Dividing each ring stage delay of 645 nanoseconds by sixteen is 40.3 nanoseconds, which is equal to each PICO unit. Therefore, seven PICO units will be needed. PICO will therefore be set to 0111, in binary for the decimal seven. The complete TEG word is therefore 0000001101,011101,0111.

A $t_{ring}$ output signal (FIG. 4) drives retriggered ring oscillators 72 and 74 in series. Each ring oscillator is associated with a NANO timing generator. Two ring oscillators are used, instead of one, because the first ring oscillator 72 will occasionally be retriggered before the second ring oscillator 74 has been able to complete a whole one-shot cycle. There is therefore a different number of NANO generators involved in frequency synthesis, the number being dependent on the minor based frequency. For example, when ROSC 52 outputs fifty MHz, only the NANO taps from the first ring oscillator 72 are used. This is because ring oscillator 72 has a total delay equal to one period of fifty MHz. But when ROSC 52 is functioning at twenty-five MHz, both ring oscillators 72 and 74 are used, because the total propagation delay time through ring oscillators 72 and 74 in series is equal to one period of twenty-five MHz. This configuration allows timebase 50 to maintain constant time resolution, notwithstanding the different frequencies of ROSC 52. The timebase now has to be converted back to the fixed frequency of ROSC 12 so that the phase and frequency can be compared. This conversion is accomplished with an on-the-fly selector 18 that subtracts a value from the present NANO select to calculate the next NANO select. This subtraction acts as a frequency multiplication resulting in an output signal $t_{ofx}$ that is equal in frequency to that from ROSC 52.

The $t_{ofx}$ path shown in FIG. 4 illustrates what is needed in theory. In practice, a simple equivalent path delay circuit between $t_{ring}$ and $t_{ofx}$ is used and actually performs better. The frequency re-conversion is unnecessary as a consequence. The delay circuit preferably mimics the delays through ring oscillators 72 and 74 and selector 80.

A retriggered system of the present invention is significantly different than a recirculating remainder type system. High speed math is required only in the PLL functions. This means only two on-the-fly math units associated with ring oscillators 72 and 74 are needed, instead of one for each TEG. The on-the-fly math units need only to operate over a MINOR range, and therefore involve only half the number of bits required for period math in prior art testers. A concern that must be addressed is that a period error may be added, which is estimated to be 0.1596/ROSC, and is based on the resolution accuracy. This small process related error can be calibrated out by look-up tables in each selector circuit. Such look-up tables are typically only 150 bits in size.

In retriggered systems the phase jitter will be accumulated over a maximum of 3·N ring element delays plus a selector delay, which is less than one hundred nanoseconds. The accumulator add time of the on-the-fly selectors must be less than a ROSC period (e.g., less than twenty nanoseconds). The system clocks $t_{ofe}$, $t_{ofe}$, and $t_{minor}$ may need static adders if their relative phase position must remain the same for system operation. Some applications may not need adders for these clocks. The minor time is divided by a fixed unit of time that is determined by (ROSC_period) J(n). ROSC and (n) are chosen so that the VPLL control signal will have an adequate margin, a threshold voltage (Vt) below power supply source VDD. Preferably, the entire PLL circuit, except loop filter capacitor, is included on an IC chip. A ROSC input buffer is preferably powered by VPLL since it is not in the feedback path. With conventional TEG word configurations, the resolution is approximately fifty picoseconds. The number of the total 3·N ring elements included in the PLL loop is preferably maximized for better resolution. The loop element outputs should be symmetrical in the PLL feedback.

Eliminating phase adjustments in the main ring means that another way to compensate for process and temperature effects in the timing path must be implemented. Delay differences at the inputs to phase detector 62 causes errors in the ring period that will adversely affect the ring pulse width. A symmetry adjustment is needed to balance the phase. A balance condition results when there is signal symmetry (e.g., 50% duty cycle) at each ring element. A phase correction system such as is shown in FIG. 5 is necessary.

Figure 5:
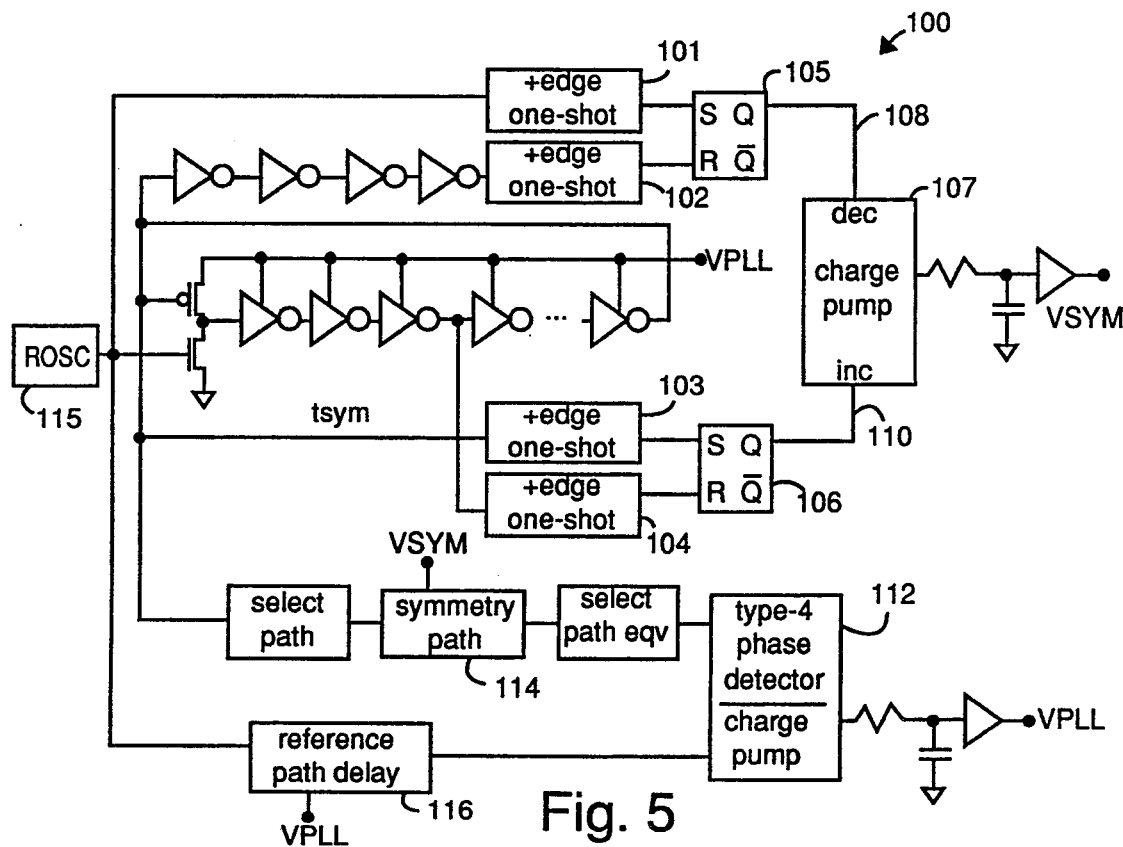
FIG. 5 is a phase corrected retriggered ring oscillator system embodiment of the present invention.

FIG. 5 illustrates a phase corrected retriggered ring oscillator system 100 similar to timebase 30 (FIG. 3). A symmetry comparator, comprising a set of four positive-edge one-shots 101–104, a pair of flip-flops 105 and 106 and a charge pump 107, is used to generate an error signal (VSYM) when two or more ring outputs are not symmetrical. An increment signal 108 and a decrement signal 110 are used to control charge pump 107 so that the ring timing path will vary over a four nanosecond range. This will compensate for small differences in the propagation times for a pair of timing paths (DUT and reference) to a phase detector 112. The mechanism to vary the delay paths' propagation times can be digital or analog. Analog is preferred, since analog control inherently provides smoother, jitter-free control. All ring element tap output signals will be identical and symmetrical when the ring is locked properly. The symmetry comparison function and phase/frequency comparison function are predicted to have a stable interaction. A delay line 114 for symmetry adjusting is included in the DUT timing path to bring it into phase with the reference path. An non-symmetrical ring output signal indicates the retriggered ring oscillator is not operating precisely at the frequency of a ROSC 115.

A VPLL-controlled reference path 116 is shown inserted between ROSC and the phase detector 112. Reference path 116 is a fixed delay path that allows the leading edge of the reference signal from ROSC 115 to lag the maximum delay of the leading edge of $t_{0fx}$ by a small margin. Such a delay may comprise a static tap selection off the main ring. A reference delay may be initially programmed to a lower value, in order to reduce the risk of choosing a wrong value that can be hard to recover from.

The effective range of the VSYM controlled variable delay must be large enough to correct for expected process and temperature extremes. With a maximum time selection path of twelve nanoseconds, about four nanoseconds is needed for the adjustment span. To do this, a constant phase difference is added to $t_{0fx}$ by offsetting a recalculation of $t_{0fx}$ with respect to ROSC. This would be done with an offset number only once, e.g., to $t_{0fx}$ at tester system reset, or by offsetting the tap selections.

Table II illustrates the steps of a symmetry/phase detector loop, such as is needed in the system of FIG. 5. The first step begins with both signal symmetry and phase lock in good condition. If ROSC begins to lead $t_{0fx}$ in phase, then voltage VPLL is lowered. If ROSC-tsym exceeds $t_{sym}$-ROSC, then voltage VSYM is increased to make ROSC lag $t_{0fx}$. Voltage VPLL is increased to lock ROSC to $t_{0fx}$.

TABLE II

Figure 6:
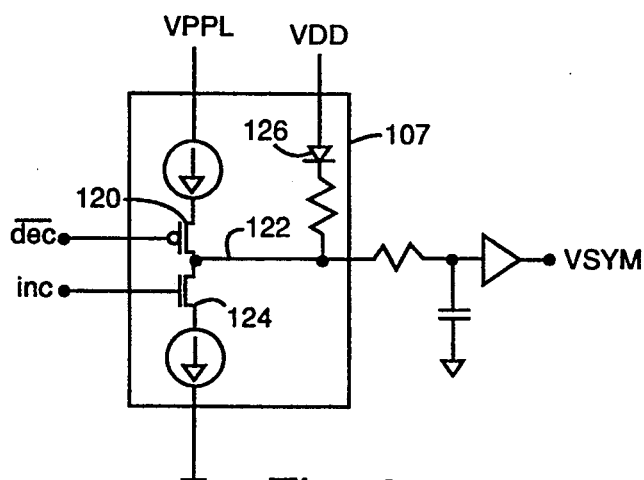
FIG. 6 is a schematic diagram of a charge pump as is included in FIG. 5.

Symmetry and Lock
ROSC leads $t_{0fx}$
Lower VPLL
ROSC-$t_{sym}$ larger than $t_{sym}$-ROSC
Increase VSYM thus ROSC lags $t_{0fx}$
Increase VPLL
ROSC Locked to $t_{0fx}$ FIG. 6 illustrates a circuit suitable for use as charge pump 107 (FIG. 5) for generating a power signal (e.g., VSYM) to control the delay between the main ring oscillator and a set of NANO retriggered ring oscillators (e.g., ring oscillators 72 and 74 in FIG. 4). Decrement signals (dec) cause a transistor 120 to pull a junction 122 toward voltage VPLL. Increment signals (inc) cause a transistor 124 to pull junction 122 toward ground. By inserting a variable delay (e.g., path 114), the DUT path signals are adjustable so process and temperature variations can be compensated. This circuit generates a power signal (VSYM) that will typically vary around VPLL. VSYM may control a string of ring elements having a range that exceeds the maximum difference that can occur in the reference path and the DUT path. A diode 126 limits the excursions of VSYM.

Within a tester implementation, any change in the period which involves the least significant bits will cause a change in time sets because a typical NANO field can vary by 2:1. NANO programming in the present invention is different than in prior art testers. For example, NANO unit values stay constant. A NANO unit is still the modulus of a minor, but it will change in its unit's quantity at different frequencies. For example, at fifty MHz, the minor might be thirty-two units, while at twenty-five MHz the minor would be sixty-four units. In this case, a unit is equal to a ring element. In the present invention, NANO includes one more bit and thus PICO is shifted from 1:4 to 0:3. The PICO unit value and range are constant. PICO divides the unit value of NANO by sixteen.

Period jitter is a function of the accuracy of the period divider vernier (fifty picoseconds). This period jitter adds to timing errors. A feedback adjustment of the two retriggered rings that feed NANO may be required.

Every implementation of a ring need not be operated as fast as a particular technology will allow in order to attain the required accuracies. Inverters that are relatively more process independent can be used to construct rings. Complementary, but slower, current-starved ring elements may be used, and thereby make a more manageable current environment. Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A frequency synthesis timebase, comprising:

a ring oscillator for generating a first frequency signal and including a plurality of consecutive stages and a plurality of corresponding output taps each tap for providing a phase shift from each succeeding tap;

a reference oscillator for generating a second frequency signal;

gating means inserted between a pair of said consecutive stages in the ring oscillator for periodically retriggering the ring oscillator in response to said second frequency signal; and phase lock loop (PLL) means for inputting and synchronizing said first frequency signal and said second frequency signal by controlling the resonant frequency of the ring oscillator.

2. The timebase of claim 1, further comprising:

an on-the-fly selector for switching among said plurality of output taps to generate an output frequency according to an order that said output taps are selected.

3. The timebase of claim 1, wherein:

the ring oscillator comprises stages with inverters connected in series; and the gating means comprises a p-gate transistor and an n-gate transistor in series between a power supply controlled by the phase lock loop means and said p-gate is connected to an output of a last inverter stage in said plurality of consecutive stages and said n-gate is connected to an output of the reference oscillator wherein the ring oscillator is retriggered each period of said second frequency signal.

4. The timebase of claim 1, further comprising:

timing path means for delaying an arrival of said second frequency signal to the PLL means wherein the phase of said first frequency signal is offset from said second frequency signal to compensate for a plurality of processing delays acting on said first frequency signal in a transmission to a device-under-test (DUT).

5. The timebase of claim 1, further comprising: ring symmetry means for adjusting the duty cycle of said first frequency signal to be substantially equal to fifty percent by the insertion of a variable timing path between the ring oscillator and the PLL means.

6. A frequency synthesis timebase, comprising:

a ring oscillator for generating a first frequency signal and including a plurality of consecutive inverter stages and a plurality of corresponding output taps each tap for providing a phase shift from each succeeding tap;

a reference oscillator input for accepting a second frequency signal external to the timebase;

gating means inserted between a pair of said consecutive stages in the ring oscillator for periodically retriggering the ring oscillator in response to said second frequency signal;

phase lock loop (PLL) means for inputting and synchronizing said first frequency signal and said second frequency signal by controlling the resonant frequency of the ring oscillator;

an on-the-fly selector for switching among said plurality of output taps to generate a synthesized output frequency according to what order said output taps are selected;

timing path means for delaying an arrival of said second frequency sign al to the PLL means wherein the phase of said first frequency signal may be offset from said second frequency signal to compensate for a plurality of processing delays acting on said first frequency signal in a transmission to a device-under-test (DUT); and ring symmetry means for adjusting the duty cycle of said first frequency signal to be substantially equal to 50% by the insertion of a variable timing path between the ring oscillator and the PLL means.

7. A retriggered oscillator timebase, comprising:

a phase lock loop controlled first ring for direct retriggering by a reference oscillator outputting a fixed reference frequency and including a plurality of taps at a plurality of successive ring stages;

a first on-the-fly selector for adding a ten-bit value to a current-tap selection to enable a next-tap selection wherein such on-the-fly addition can increase the period of a signal each cycle and thereby divide the reference frequency;

a pair of second and third retriggered rings for driving a pair of NANO timing edge generators (TEGs) including one for a "present" select and one for a "next" select wherein the pair of rings permits retriggering of one of the rings before the other may complete a whole one-shot cycle; and a second on-the-fly selector for subtracting a value from a present "NANO" select to a next "NANO" select to convert back a timebase to said fixed reference frequency for phase and frequency comparison wherein said subtraction functions as a frequency multiplication with a frequency signal output "$t_{0fx}$" that is substantially equal to said fixed reference frequency.

* * * * *